United States Patent [19]

Inoue

[11] 4,392,043
[45] Jul. 5, 1983

[54] PULSE GENERATOR

[75] Inventor: Kiyoshi Inoue, Tokyo, Japan

[73] Assignee: Inoue-Japax Research Incorporated, Yokohama, Japan

[21] Appl. No.: 238,744

[22] Filed: Feb. 27, 1981

[30] Foreign Application Priority Data

Feb. 28, 1980 [JP] Japan .................................. 55/23346

[51] Int. Cl.$^3$ ............................................... B23P 1/02
[52] U.S. Cl. ................................ 219/69 P; 219/69 C; 377/107
[58] Field of Search ................. 219/69 P, 69 C, 69 R, 219/69 G, 69 M, 492, 10.55 B; 235/92 R, 92 B, 92 ME, 132 A

[56] References Cited

U.S. PATENT DOCUMENTS

| | | | |
|---|---|---|---|
| 3,264,517 | 8/1966 | Ullmann et al. | 219/69 P |
| 3,805,012 | 4/1974 | Bell, Jr. et al. | 219/69 P |
| 3,809,848 | 5/1974 | Bell, Jr. | 219/69 P |
| 3,973,104 | 8/1976 | Ullmann et al. | 219/69 P |
| 4,292,490 | 9/1981 | Bell, Jr. et al. | 219/69 C |

Primary Examiner—M. H. Paschall
Attorney, Agent, or Firm—Karl F. Ross; Herbert Dubno

[57] ABSTRACT

A pulse generator, e.g. for electrical machining such as EDM, is provided which comprises: an on-time setting unit for selectively setting on-times, a first matrix circuit for producing a first output signal on a selected output thereof corresponding to a particular on-time set in the on-time setting unit; an off-time setting unit, independent of the on-time setting unit, for selectively setting off-times; a second matrix circuit, independent of the first matrix circuit, for producing a second output signal on a selected output thereof corresponding to a particular off-time set in the off-time setting unit; a clock pulser for producing clock pulses; a single preset counter for counting the clock pulses; and a circuit for establishing, in the single preset counter, first and second levels to be reached by the clock pulse count in accordance with the first and second output signals, respectively. The circuit is operable, upon the count of the counter in a first mode reaching the first level, to switch the latter to the second level and, upon the count of the counter in a second mode reaching the second level, to switch the latter to the first level, whereby the circuit provides an on-output signal while the preset counter is in the first mode and an off-output signal while the preset counter is in the second mode.

8 Claims, 2 Drawing Figures

PULSE GENERATOR

FILED OF THE INVENTION

The present invention relates to a pulse generator and, more particularly, to a pulse generator capable of setting the on-time, off-time and frequency of output pulses in an extremely wide range and with reliability. The pulse generator herein disclosed in particularly advantageous for providing a train of high-frequency square-wave pulses as required in electrical discharge machining (EDM).

BACKGROUND OF THE INVENTION

A pulse generator capable of providing square-wave pulses whose on-time (pulse duration), off-time (pulse interval) and frequency (repetition rate) can be variably set has become increasingly important to the industry. Typical examples are found in the art of electrical machining. Thus, in EDM, high-frequency electroerosive machining pulses of precisely regulated pulse on-time and off-time are required having these pulse parameters desirably varied in a wide range of settings. The need for electrical pulses of adjustable time settings has also been recognized in electrochemical machining (ECM), electrochemical-discharge machining (ECDM), electrical sintering, electroplating, arc welding and so forth.

Pulse generators which have hitherto been utilized and proposed either entail extremely complex circuit configurations or have severe restrictions in the possible width and number of settings. Thus, in conventional circuit arrangements of relatively high grade designed to possess a wider range of settings and a fine intersetting pitch, a high-capacity memory is employed to secure ease of setting. Data for all selectable on-times and off-times are registered in the memory and, among them, a desired on-time and off-time are selectively read out and retrieved through an address selection circuit. Each output pulse is held on or off until clock pulses occurring at a preselected frequency reach a set value corresponding to the on-time of off-time retrieved. Then the address selection circuit is acted upon to control the on-time or off-time duration of output pulses. The device therefore is highly complicated and unavoidably expensive. As the capacity of the memory is increased, the access time cannot be negligible and this imposes a severe limitation on the width of the range of selectable on-time and off-time settings, the number of applicable setting steps and the maximum operable frequency.

OBJECTS OF THE INVENTION

It is accordingly an important object of the present invention to provide an improved pulse generator constructed, without a high-capacity memory, to possess a greater range of settings and a finer intersetting pitch and operable with reliability over an increased frequency range.

Other objects will become apparent as the description which follows proceeds.

SUMMARY OF THE INVENTION

In accordance with the present invention there is provided a pulse generator which comprises: on-time setting means for selectively setting on-times; a first matrix circuit for producing a first output signal on a selected output thereof corresponding to a particular on-time set in the on-time setting means; off-time setting means, independent of the on-time setting means, for selectively setting off-times; a second matrix circuit, independent of the first matrix circuit, for producing a second output signal on a selected output thereof corresponding to a particular off-time set in the off-time setting means; a clock pulser for producing clock pulses; a single preset counter means for counting the clock pulses; and circuit means for establishing, in the single preset counter means, first and second levels to be reached by the clock pulse count in accordance with the first and second output signals, respectively, the circuit means being operable, upon the count of the counter means in a first mode reaching the first level, to switch the latter to the second level and, upon the count of the counter means in a second mode reaching the second level, to switch the latter to the first level, whereby the circuit means provides an on-output signal while the preset counter means is in the first mode and an off-output signal while the preset counter means is in the second mode.

The present invention also provide in a second aspect thereof an electrical machining apparatus comprising in combination: a a machining tool; means for supporting an electrically conductive workpiece in juxtaposition with the tool; and a pulse generator for applying machining pulses across the tool and the workpiece to electrically machine the workpiece with the tool, the pulse generator comprising: on-time setting means for selectively setting on-times, a first matrix circuit for producing a first output signal on a selected output thereof corresponding to a particular on-time set in the on-time setting means, off-time setting means, independent of the on-time setting means, for selectively setting off-times, a second matrix circuit, independent of the first matrix circuit, for producing a second output on a selected output thereof corresponding to a particular off-time set in the off-time setting means, a clock pulser for producing clock pulses, a single preset counter means for counting the clock pulses, and circuit means for establishing, in the single preset counter means, first and second levels to be reached by the clock pulse count in accordance with the first and second output signals, respectively, the circuit means being operable, upon the count of the counter means in a first mode reaching the first level, to switch the latter to the second level and, upon the count of the counter means in a second mode reaching the second level, to switch the latter to the first level, whereby the circuit means provides an on-output signal while the preset counter means is in the first mode and an off-output signal while the preset counter means is in the second mode.

The on-time setting means and the off-time setting means may each be a selector switch. The first and second matrix circuits may each be a diode matrix. The clock pulser may include a plurality of channels for providing clock pulses of different periods.

BRIEF DESCRIPTION OF DRAWING

These and other objects, features and advantages of the present invention will be more readily understood from a reading of the following description of certain embodiments thereof taken with reference to the accompanying drawing in which.

SPECIFIC DESCRIPTION

Figure 1:
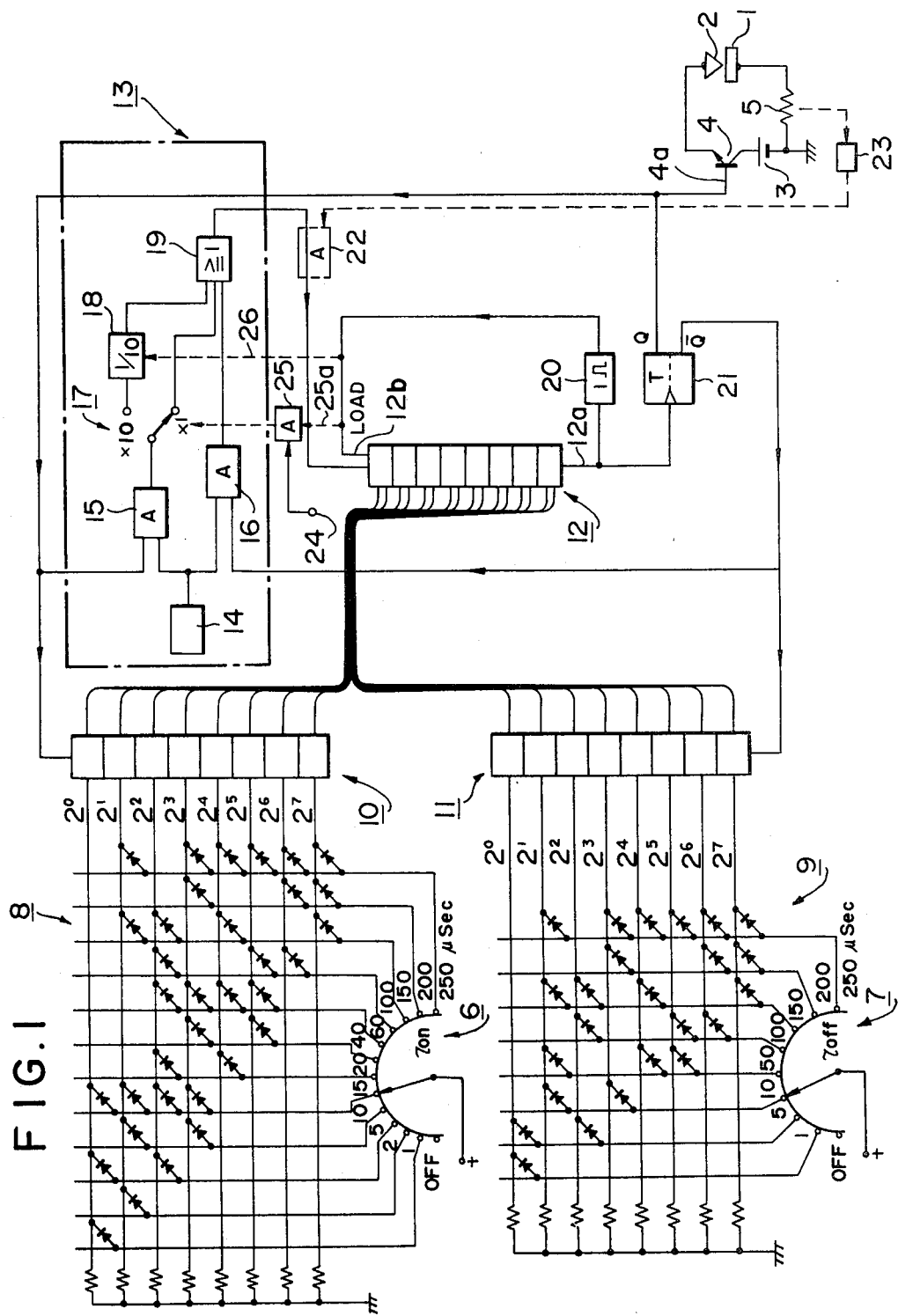
FIG. 1 is a circuit diagram of a pulse generator embodying the principles of the invention.

Pulse generators of the invention will hereinafter be described with particular reference to an EDM power supply shown in FIGS. 1 and 2 for providing a succession of electroerosive pulses across a machining gap formed between a workpiece 1 and a tool electrode 2 and flushed with a machining liquid. The basic EDM power supply comprises a DC source 3 and a power switch 4, e.g. a bank of power transistors, having its principal electrodes connected to the DC source 3, the tool electrode 2 and the workpiece 1 in series with a resistor 5. The power switch 4 has its control electrodes energized through a terminal 4a by output pulses of a pulse generator yet to be described for alternately connecting and disconnecting the DC source 3 to the tool electrode 2 and the workpiece 1, thereby furnishing the machining gap with successive time-spaced voltage pulses. Each voltage pulse may result in an electrical discharge of extremely high current density to electroerosively remove material from the workpiece 1 and a succession of such discrete and time-spaced electrical discharges achieve cumulative stock removal from the workpiece 1. An amplifier stage is commonly employed for connection intermediate between the terminal 4a and the power switch 4 but is not shown for the sake of simplicity.

Referring to FIG. 1, the pulse generator includes an on-time setting unit 6 and an off-time setting unit 7, each of which may be a selector switch of ordinary design operated either manually or automatically, e.g. through a relay arrangement actuated by an electrical input signal. The units 6 and 7 are used to set the on-time or pulse duration $\tau$on and the off-time or pulse interval $\tau$off, respectively, of successive signal pulses furnished to the terminal 4a and hence of successive voltage pulses applied across the machining gap between the tool electrode 2 and the workpiece 1. It is desired that the on-time setting unit 6 include 30 to 50 selection taps and the off-time setting unit 7 include 10 to 30 selection taps, although they are shown having lesser numbers of taps in the interest of simplicity of illustration, for, say, 1 microsecond to, say, 256 microseconds to cover an extended range and fine pitch of selection.

The on-time setting unit 6 is connected to a first matrix circuit 8 while the off-time setting unit 7 is connected to a second matrix circuit 9, each of the two independent matrices 8 and 9 being embodied in the form of a diode matrix. The functions of the matrix circuits 8 and 9 are to encode each on-time $\tau$on set for selection in the on-time setting unit 6 and each off-time $\tau$off set for selection in the off-time setting unit 7. Thus, each on-time $\tau$on set and each off-time $\tau$off set are converted by the matrix circuits 8 and 9, respectively, into binary numbers which are in turn stored in a first buffer register 10 and a second buffer register 11, respectively. The binary signals from the buffer registers 10 and 11 are furnished to a preset counter 12.

A clock pulser 13 shown comprises an oscillator 14, AND circuits 15 and 16, a magnification selector switch 17, a frequency divider 18 and an OR gate 19. The preset counter 12 has an output terminal 12a returned to its load setting stage 12b via a one-shot multivibrator 20 and also connected to a T-bistable element 21 having a Q-terminal leading to the output terminal 4a of the system and also returned to the first buffer register 10 and a $\overline{Q}$-terminal returned to the second buffer register 11. The AND gate 15 is responsive to clock signals of the oscillator 14 and to the Q-terminal output of the bistable element 21 while the AND gate 16 is responsive to clock signals of the oscillator 14 and the $\overline{Q}$-terminal output of the bistable element 21.

Thus, the preset counter 12 has a first load level corresponding to the encoded value stored in the first buffer register 10 when the T-bistable element 21 has a "1" output at its Q-terminal and a second load level corresponding to the encoded value stored in the second buffer register 11 when the element 21 has a "0" output at its Q-terminal or a "1" output at its $\overline{Q}$-terminal.

In the clock pulser 13, the pulses of the oscillator 14 are enabled, when the Q-terminal of the bistable element 21 has the "1" output, to pass through the AND gate 15 and then to reach the OR gate 19 directly or through the frequency divider 18 depending upon the position of the selector switch 17. When the Q-terminal has the "0" output or $\overline{Q}$-terminal has the "1" output, the pulses of the oscillator 14 are allowed to pass through the AND gate 16 to reach the OR gate 19. The selector switch 17 and the frequency divider 18 are provided to extend the on-time $\tau$on set at the unit 6 by N-times, say, ten times. With the switch 17 held at the position indicated by x10, the period of the output pulse to be issued from the clock pulser 13 is extended to the period of the output pulse from the oscillator 14 multiplied by ten, when the Q-terminal is issuing the "1" output and the preset counter 12 is loaded with the registered value of the first encoder 10.

The preset counter 12 is designed to count the output pulses of the clock pulser 13. When the counts reach a preset value or load level, the counter 12 issues an output signal which is applied to the bistable element 21 to reverse its states, thereby alternating or switching the preset value or load level of the counter 12 as described previously. In this manner, a succession of signal pulses are provided at the output terminal 4a of the pulse generator to provide a succession of machining voltage pulses of the precisely regulated on-time $\tau$on, off-time $\tau$off and frequency f between the tool electrode 2 and the workpiece 1.

Optionally, a further AND gate 22 and a detector circuit 23 may be provided. The detector circuit 23 is used to sense the development of an electrical discharge as a result of the application of a voltage pulse across the machining gap. The AND gate 22 connected between the OR gate 19 and the preset counter 12 responds to the sensing signal of the detector circuit 23 to allow the counter 12 to initiate counting the clock pulses from the OR gate 19 only after the development of an electrical discharge so that the electrical discharge continues for the on-time $\tau$on established at the setting unit 6.

A terminal 24 may also be used optionally to respond to the machining condition of the load or EDM gap as ascertained by any known circuit arrangement (not shown) and to feed into the first input terminal of an AND gate 25 having the second input terminal responsive to the output of the one-shot multivibrator 20 applied through a circuit line 25a. When an input appears at the terminal 24, the AND gate 25 is enabled to act on the selector switch 17 so as to connect the AND gate 15 to the frequency divider 18, thereby permitting the duration of an electrical discharge to be longer or shorter than the on-time $\tau$on established at the setting unit 6 in accordance with a particular gap condition detected. A similar control option may be provided for the off-time setting alternatively or as well.

Although not shown, a "no wear" switch, e.g. pushbutton switch, may further be included in the on-time setting unit 6 which, when pushed or actuated, establishes a new on-time which is a multiplication of the registered on-time by, say, ten (x10) and acts on the selector switch 17 to establish a multiplication by ten channel in the frequency divider 18. Alternatively, a rotary switch which has ten selection taps permitting longer on-time settings up to, say, 2560 microseconds may be added in the unit 6 so that when an on time $\tau$on greater than 256 microseconds is selected, the corresponding channel in the frequency divider may become effective to allow a "no wear" mode to be established in the power supply.

The output of the one-shot multivibrator 20 may also be applied through a circuit line 26 to clear or reset the frequency divider 18 when in an effective state so that there should be no error signal arising from any incomplete signal which may precede for storage in the register 10 or 11.

Figure 2:
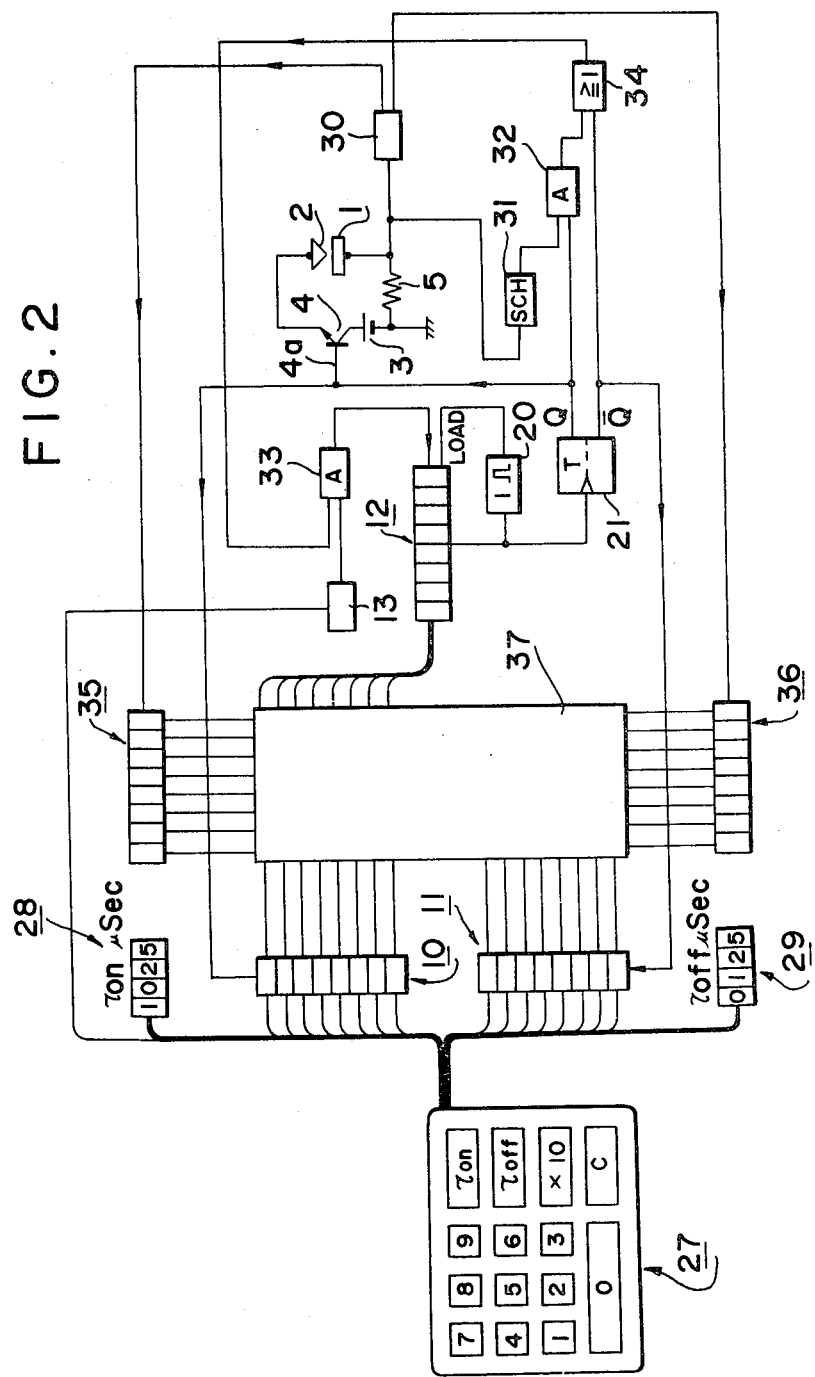
FIG. 2 is a circuit diagram of another embodiment of the pulse generator according to the invention.

Referring next to FIG. 2 wherein the same reference numerals (1 through 5, 10 through 13, 20 and 21) are used to refer to the same functional elements as in FIG. 1, a modified pulse generator according to the invention is shown. In this embodiment, the on-time setting unit and the off-time setting unit are served by an intergral time setting unit 27 having ten setting keys and associated with an on-time display 28 and an off-time display 29. Each on-time $\tau$on and each off-time $\tau$off are set with the unit 27 and indicated by displays 28 and 29 and converted into two binary numbers which are then registered in the first and second buffer registers 10 and 11, respectively.

The buffer registers 10 and 11 feed into a processing unit 37 connected to the preset counter 12 and provided with third and fourth buffer registers 35 and 36 in which multipliers for correcting the on-time $\tau$on and the off-time $\tau$off are set, respectively, in reponse to the control output of a gap discharge monitoring circuit 30 connected to the tool electrode 2 and the workpiece 1. A Schmitt-trigger circuit 31 is also connected to the machining gap and feeds into one input terminal of an AND gate 32 which has another input terminal leading from the $\overline{Q}$ terminal of the T-bistable element 21. The AND gate 32 has its output connected to one input terminal of an OR gate 34 which has another input leading from the Q terminal of the T-bistable element 21. The OR gate 34 has its output connected to one input of a further AND gate 33 which has another input leading from the clock pulser 13 previously described. These elements are included to prevent clock pulses of the clock pulser 13 from coming into the preset counter 12 as long as no electrical discharge develops through the machining gap following the instant at which the power switch 4 is turned on. In this embodiment, it follows therefore that the duration of each discharge pulse is set as the on-time $\tau$on. The off-time $\tau$off is here the time interval between successive voltage pulses or the time duration in which the power switch is turned off.

In this embodiment, it will be appreciated that neither on-time $\tau$on or off-time $\tau$off is determined directly by the number stored in the register 10, 11. The on-time $\tau$on is determined by the number stored in the register 10 and the multiplier stored in the register 35 and the off-time $\tau$off is determined by the number stored in the register 11 and the multiplier stored in the register 36. The numbers stored in the registers 35 and 36 are automatically set by the monitoring unit 30 so as to maintain an optimal discharge condition in the machining gap. Accordingly, each of the on-time $\tau$on and off-time $\tau$off of discharge pulses is a time determined by a reference setting multiplied by a correction factor derived from the machining gap to maintain an optimum discharge condition.

There is thus provided a new and useful pulse generator which, without resort to a large-capacity memory, permits settings over an increased range and with a finer pitch, which is capable of providing high-frequency square-wave pulses and which can advantageously be combined with a power supply for electrical machining.

What is claimed is:

1. A pulse generator comprising:
   on-time setting means for selectively setting on-times;
   a first matrix circuit for producing a first output signal on a selected output thereof corresponding to a particular on-time set in said on-time setting means;
   off-time setting means, independent of said on-time setting means, for selectively setting off-times;
   a second matrix circuit, independent of said first matrix circuit, for producing a second output signal on a selected output thereof corresponding to a particular off-time set in said off-time setting means;
   a clock pulser for producing clock pulses;
   a single preset counter means for counting said clock pulses; and
   circuit means for establishing, in said single preset counter means, first and second levels to be reached by the clock pulse count in accordance with said first and second output signals, respectively, said circuit means being operable, upon the count of said counter means in a first mode reaching said first level, to switch the latter to said second level and, upon the count of said counter means in a second mode reaching said second level, to switch the latter to said first level, whereby said circuit means provides an on-output signal while said preset counter means is in said first mode and an off-output signal while said preset counter means is in said second mode.

2. The pulse generator defined in claim 1 wherein each of said on-time setting means and off-time setting means comprises a selector switch.

3. The pulse generator defined in claim 1 wherein said clock pulser includes a plurality of channels for providing clock pulses of different periods.

4. An electrical machining apparatus comprising in combination:
   a machining tool;
   means for supporing an electrically conductive workpiece in juxtaposition with said tool; and
   a pulse generator for applying machining pulses across said tool and said workpiece to electrically machine said workpiece with said tool, said pulse generator comprising:
   on-time setting means for selectively setting on-times,
   a first matrix circuit for producing a first output signal on a selected output thereof corresponding to a particular on-time set in said on-time setting means,
   off-time setting means, independent of said on-time setting means, for selectively setting off-times, a second matrix circuit, independent of said first matrix circuit, for producing a second output signal on a selected output thereof corresponding to a particular off-time set in said off-time setting means, a clock pulser for producing clock pulses, a single preset counter means for counting said clock pulses, and circuit means for establishing, in said single preset counter means, first and second levels to be reached by the clock pulse count in accordance with said first and second output signals, respectively, said circuit means being operable, upon the count of said counter means in a first mode reaching said first level, to switch the latter to said second level and, upon the count of said counter means in a second mode reaching said second level, to switch the latter to said first level, whereby said circuit means provides an on-output signal while said preset counter means is in said first mode and an off-output signal while said preset counter means is in said second mode.

5. The electrical machining apparatus defined in claim 4 wherein each of said on-time setting means and off-time setting means comprises a selector switch.

6. The electrical machining apparatus defined in claim 4 wherein said clock pulser includes a plurality of channels for providing clock pulses of different periods.

7. The pulse generator defined in any one of claim 1, claim 2 or claim 3 wherein each of said first and second matrix circuits comprises a diode matrix.

8. The electrical machining apparatus defined in any one of claim 4, claim 5 or claim 6 wherein each of said first and second matrix circuits comprises a diode matrix.

* * * * *